(12) United States Patent
Schoellkopf et al.

(10) Patent No.: US 7,646,069 B2
(45) Date of Patent: Jan. 12, 2010

(54) HIGH DENSITY INTEGRATED READ-ONLY MEMORY (ROM) WITH REDUCED ACCESS TIME

(75) Inventors: Jean Pierre Schoellkopf, Grenoble (FR); Bertrand Borot, Le Cheylas (FR)

(73) Assignee: STMicroelectronics SA, Montrouge (FR)

( * ) Notice: Subject to any disclaimer, the term of this patent is extended or adjusted under 35 U.S.C. 154(b) by 461 days.

(21) Appl. No.: 11/337,101

(22) Filed: Jan. 19, 2006

(65) Prior Publication Data
US 2006/0226460 A1    Oct. 12, 2006

(30) Foreign Application Priority Data
Jan. 19, 2005    (FR) .................................. 05 00546

(51) Int. Cl.
   *H01L 47/00*    (2006.01)
(52) U.S. Cl. ................ 257/390; 257/401; 257/903; 257/E27.102
(58) Field of Classification Search ............ 257/390, 257/401, 903, E27.102
   See application file for complete search history.

(56) References Cited

U.S. PATENT DOCUMENTS

| | | | | |
|---|---|---|---|---|
| 4,684,967 A | * | 8/1987 | Taylor et al. ............... 257/394 |
| 5,635,742 A | * | 6/1997 | Hoshi et al. ................ 257/337 |
| 5,917,224 A | * | 6/1999 | Zangara .................... 257/390 |
| 5,965,925 A | | 10/1999 | Kornachuk et al. ......... 257/401 |
| 5,973,354 A | * | 10/1999 | Chang ....................... 257/315 |
| 6,002,156 A | * | 12/1999 | Lin .......................... 257/356 |
| 6,601,224 B1 | | 7/2003 | Kiss et al. .................. 716/8 |
| 7,053,447 B2 | * | 5/2006 | Verhoeven .................. 257/324 |
| 2002/0175353 A1 | * | 11/2002 | Dray et al. ................ 257/260 |

FOREIGN PATENT DOCUMENTS

| | | |
|---|---|---|
| FR | 2 406 308 | 6/1979 |
| FR | 2 823 900 | 10/2002 |
| JP | 3-132079 | 6/1991 |
| JP | 6-204468 | 7/1994 |

* cited by examiner

*Primary Examiner*—Eugene Lee
(74) *Attorney, Agent, or Firm*—Lisa K. Jorgenson; Robert Iannucci; Seed IP Law Group PLLC

(57) ABSTRACT

An integrated circuit memory of the read-only memory type includes at least one memory cell. Each memory cell includes a storage transistor realized in a semiconductor substrate and presenting a source connected to a reference potential, a gate connected to an electrically conductive word line, and a drain connected to an electrically conductive bit line by an optional connection depending on whether the memory cell is assigned the value 0 or 1. The storage transistor of each memory cell includes a gate formed on the substrate, in the form of a window whose inner contour delimits a central drain region in the substrate, and whose outer contour delimits at least one source region in the substrate.

20 Claims, 5 Drawing Sheets

HIGH DENSITY INTEGRATED READ-ONLY MEMORY (ROM) WITH REDUCED ACCESS TIME

This invention relates to read-only memory or ROM, that is, memory which can only be accessed in order to read the information content that is stored there.

It applies particularly, but not exclusively, to CMOS065 ("Complementary Metal Oxide Semiconductor") read-only memory technology with etching precision of 65 nm.

Standard read-only memories include a network of elementary memory cells (memory point) arranged in lines and columns. All the memory cells in the same line are activated by a first metallization, commonly designated "word line," while all the cells in the same column may be read from the voltage at the terminals of a column metallization called "bit line". More precisely, activating a word line and measuring the voltage of a bit line makes it possible to read the content of the memory cell located at the intersection of this word line and this bit line. The value of the stored information then depends on the level (high or low) of the voltage measured on the bit line. A standard read-only memory cell therefore codes just one bit (it can have two values: zero or one).

In FIGS. 1A and 1B, such a read-only memory cell is represented including a storage transistor T whose source S is connected to a first metallization GND itself connected to a reference potential such as, for example, the ground. The gate G of the storage transistor T is connected to a second metallization WL constituting a word line. The source S of the storage transistor is connected to a third metallization BL constituting a bit line.

When the integrated circuit is fabricated, according to the programming of the mask level corresponding to the contacts and defining the memory content, the bit line BL is either connected or not connected to the drain D of the storage transistor T (FIG. 1A), or the source of the storage transistor is either connected or not connected to the ground line GND (FIG. 1B).

When the memory cell is read, the bit line BL is preloaded, as is standard, with the supply voltage Vdd. When the word line WL is activated (for example, by applying the supply voltage on this word line), if the bit line is connected to the drain D of the transistor T (FIG. 1A) or if the transistor source S is connected to the ground, the transistor T is passing. Consequently, the bit line is discharged and the bit line BL voltage falls. On the other hand, if the transistor drain or source is not connected, the bit line cannot be connected to the ground line by means of the transistor, and therefore will not be discharged. The voltage at the terminals of the bit line BL will then remain at its nominal value Vdd (except in the case of a leak). The binary value 1 is assigned, for example, when the bit line voltage remains equal to the supply voltage Vdd, and the binary value 0 is assigned when the bit line BL is discharged.

The reading principle that has just been described also applies to several memory cells associated respectively with bit lines and a single word line WL. By applying the supply voltage on the word line, the respective bits lines of all the memory cells connected to this word line can be read simultaneously.

FIGS. 2 to 7 illustrate different examples of portions of read-only memory according to the prior art. FIGS. 2 and 3 show a first example in cross-section according to a bit line BL and in a view from above respectively.

FIG. 2 shows a pair of memory cells with a common drain D1, while FIG. 3 shows eight pairs of such memory cells. In FIGS. 2 and 3, every memory cell of each pair includes a storage transistor realized in a standard and known fashion itself within a semiconductor substrate, the storage transistor comprising a source region S1, S2, a drain region D1 common with the other storage transistor of the memory cell pair, and a gate G1, G2. Each pair of memory cells is separated from its neighbors by insulating regions 16.

The sources S1, S2 of the storage transistors of each pair of memory cells are connected to the ground GND belonging to a first metallization plane, by a metal interconnection 11, 15 commonly designated by persons skilled in the art as a "via" or "contact", this interconnection (represented in dashed lines in FIG. 2) being planned or not when the memory cell is fabricated, depending on whether the memory cell is assigned the binary value 0 or 1 (case of FIG. 1B).

The common drain D1 of the storage transistors of each pair of memory cells is connected to a bit line BL belonging to a second metallization plane by means of a metal connection or post. This post extends perpendicularly to the different metallization planes, and possesses a first section 12 connecting the drain D1 of the cell's storage transistor to a portion 13 of the first metallization plane, and a second section 14 joining the portion 13 to the bit line BL.

The gates G1, G2 of the storage transistors of each pair of memory cells are realized in the form of polysilicon bars (polycrystalline silicon), common to several pairs of memory cells (FIG. 3), and are connected to metallizations that are not represented forming the word lines WL.

FIGS. 4 and 5 illustrate in section and in plan view another example of read-only memory according to the prior art.

FIG. 4 shows a pair of memory cells with a common source S3, while FIG. 5 shows eight pairs of such memory cells. In these figures, each memory cell of each pair includes a storage transistor consisting of a source region S3 common to the other storage transistor of the memory cell pair, a drain region D2, D3 and a gate G1, G2. Each pair of memory cells is separated from its neighbors by insulation regions 16.

The source S3 common to the two storage transistors of each pair of memory cells is connected to the ground GND belonging to a first metallization plane, by a metal interconnection 22.

Each of the drains D2, D3 of the storage transistors of each memory cell pair is connected to the bit line BL belonging to a second metallization plane, by means of a via 21, 23 respectively joining the drain to a portion 24, 26 respectively of the first metallization plane, and by a via 25, 27 respectively joining the portion 24, 26 to the bit line. The via 21, 23 (represented in dashed lines in FIG. 4) are planned or not when the memory cell is fabricated, depending on whether the memory cell is assigned the binary value 0 or 1 (case of FIG. 1A).

The gates G1, G2 of the storage transistors of each pair of memory cells are realized in the form of polysilicon bars, common to several pairs of memory cells (FIG. 3), and are connected to metallizations that are not represented forming the word lines WL.

FIG. 6 illustrates a variant of the memory cells of FIG. 4, in which the optional connections to assign the value of 0 or 1 to the memory cell are constituted not by the via 21, 23 between the drain regions D2, D3 and the metallization portions 24, 26 of the first metallization plane, but by the via 25, 27 (represented in dashed lines) between these metallization portions and bit lines BL.

FIG. 7 illustrates a variant of the memory cells represented in FIGS. 4 and 6, in which the bit lines BL are formed not in a second metallization plane, but in a third metallization plane. Each of the metal connections between the source regions S2, S3 and the bit lines then include a third via 32, 34 between a corresponding portion 31, 33 of the second metallization plane and the bit line BL. In this variant, the via 32, 34 (represented in dashed lines) are planned or not when the memory cell is fabricated, depending on whether the memory cell is assigned the binary value 0 or 1.

In all these read-only memory examples according to the prior art, the more the integration scale is reduced, that is to say the memory size, the more the width W (FIG. 3) of the doped regions forming the sources and drains of the storage transistors is reduced, which leads to a reduction in the reading current of the memory cells (discharge of the bit lines) and therefore to an increase in the reading time of the memory.

One objective of this invention is to eliminate this drawback. This goal is achieved by planning an integrated circuit memory of the read-only memory type including at least one memory cell, each memory cell including one storage transistor realized in a semiconductor substrate and presenting a source connected to a reference potential, a gate connected to an electrically conductive word line, and a drain connected to an electrically conductive bit line by means of an optional connection depending on whether the memory cell is assigned the value 0 or 1.

According to the invention, the storage transistor of each memory cell presents a gate formed on the substrate, in the form of a window whose inner contour delimits a central drain region in the substrate, and whose outer contour delimits at least one source region in the substrate.

According to the invention, the read-only memory includes several memory cells, the gates of the memory cell storage transistors being realized by at least one set of gates comprises a widened part including windows whose inner contours delimit the respective drain regions of the storage transistors in the substrate, the outer contours of the set of gates delimiting the source regions of the storage transistors in the substrate.

Advantageously, the gate window of each storage transistor presents an essentially rectangular inner contour.

Alternately, the gate window of each storage transistor presents an essentially circular inner contour.

According to one embodiment of the invention, the source regions are connected to the reference potential by means of connections formed on the substrate on both sides of end portions of the set of gates, narrower than the widened part comprising the windows.

According to one embodiment of the invention, the set of gates is connected to the word line by means of connections formed on end parts of the set of gates, narrower than the widened part comprising the windows.

According to one embodiment of the invention, the source regions are connected to the reference potential by means of an electrically conductive source line, the bit line being realized in a first electrically conductive plane separated from the substrate by a first insulating layer, the word and source lines being realized in a second electrically conductive plane separated from the first plane by a second insulating layer.

According to one embodiment of the invention, the source regions are connected to the ground by means of an electrically conductive source line, the word and source lines being realized in a first electrically conductive plane separated from the substrate by a first insulating layer, the bit line being realized in a second electrically conductive plane separated from the first plane by a second insulating layer.

The invention also concerns a transistor containing source and drain regions formed in a semiconductor substrate and a polysilicon gate deposited on the substrate.

According to the invention, the gate presents the shape of a window whose inner contour delimits one of the drain and source regions in the substrate, and whose outer contour delimits the other drain and source region in the substrate.

A preferred embodiment of the invention will be described below as a non-limiting example, with reference to the attached drawings in which.

Figure 8:
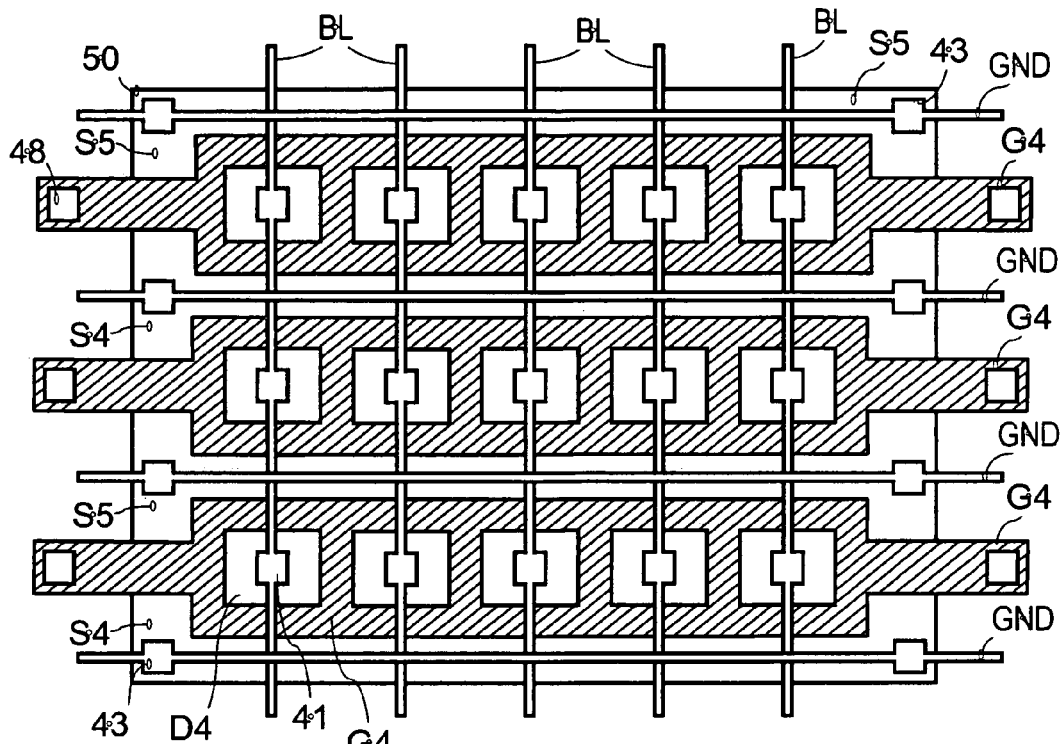
FIG. 8 represents in plan view memory cells according to the invention.

The FIG. 8 represents in plan view a set of memory cells arranged in lines and columns, and realized in a substrate 50 in which source regions S4, S5, and drain regions D4 are formed, and on which sets of polysilicon (polycrystalline silicon) gates G4 (three) are deposited, forming the gates of the memory cell storage transistors. The set of memory cells represented includes 15 memory cells.

Figure 1A:
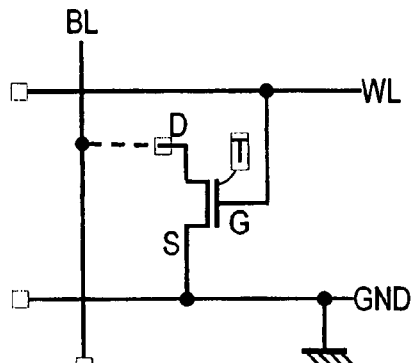
FIGS. 1A and 1B represent electronic diagrams of the principle of a read-only memory cell.
Figure 1B:
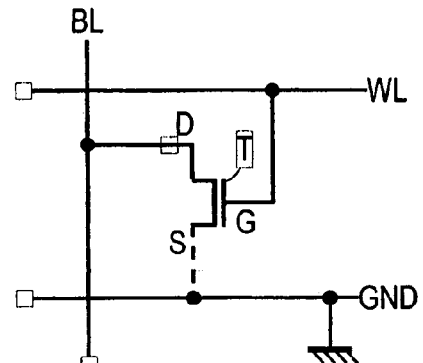
Figure 2:
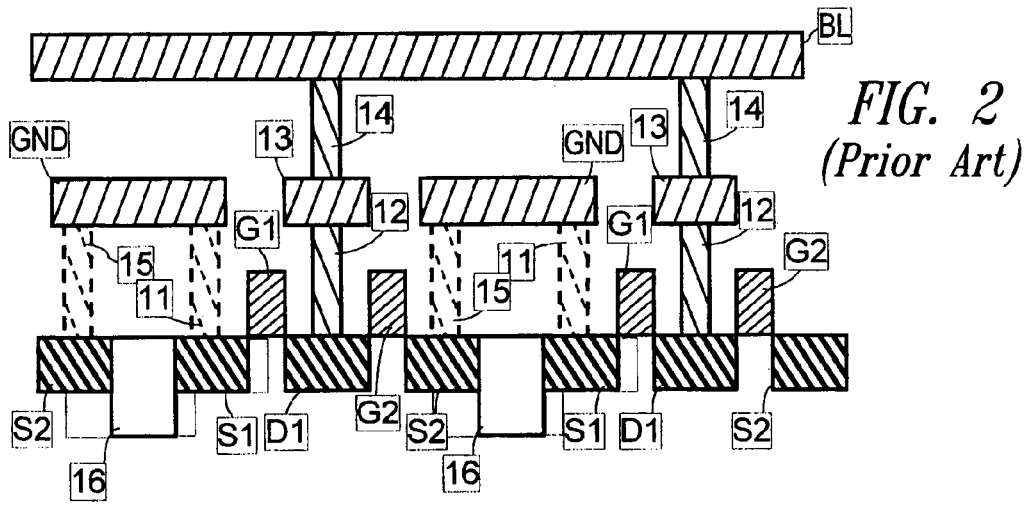
FIGS. 2 and 3 show in cross section and in plan view respectively memory cells with a common drain, according to the prior art.
Figure 4:
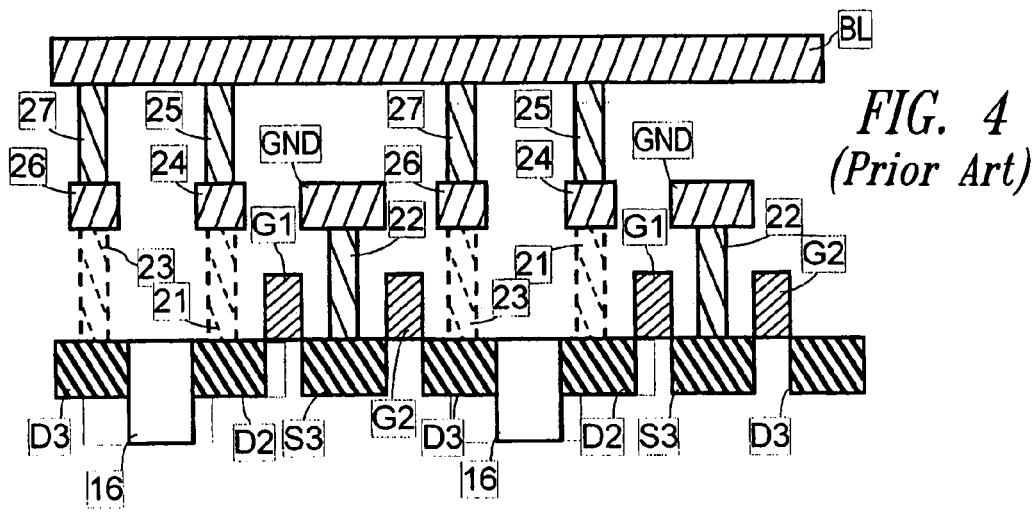
FIGS. 4 and 5 show in cross section and in plan view respectively memory cells with a common source, according to the prior art.
Figure 3:
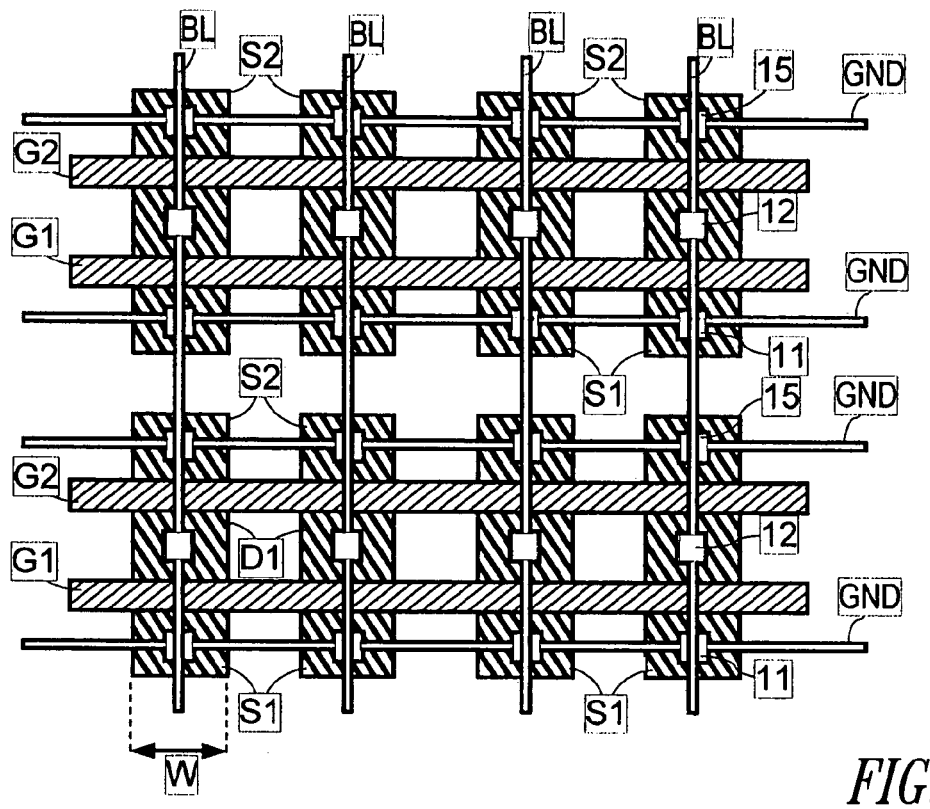
Figure 5:
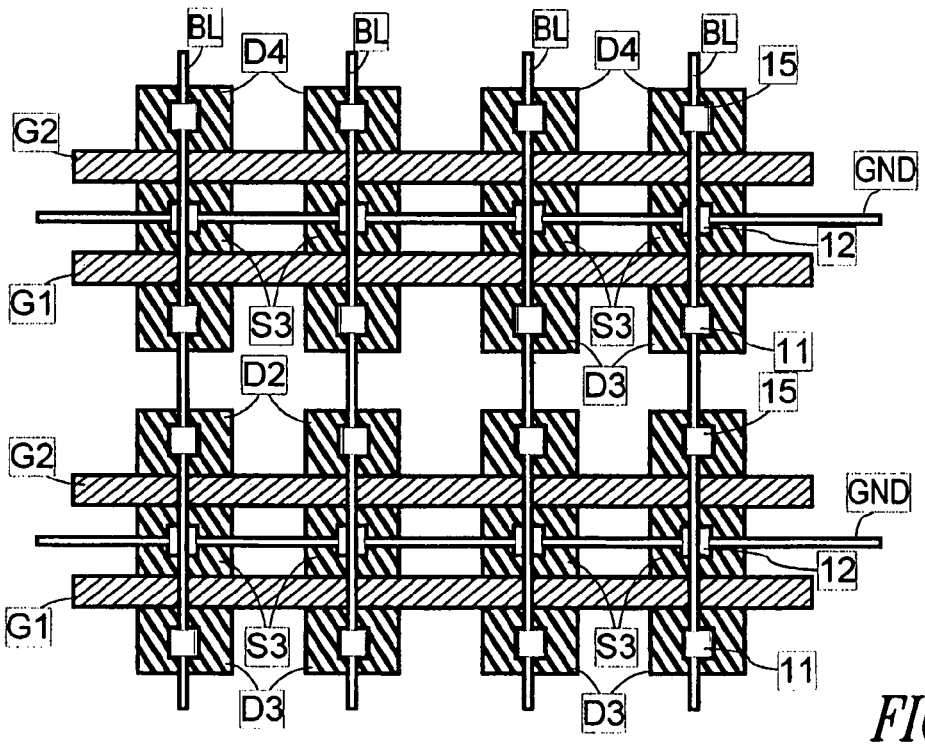
Figure 6:
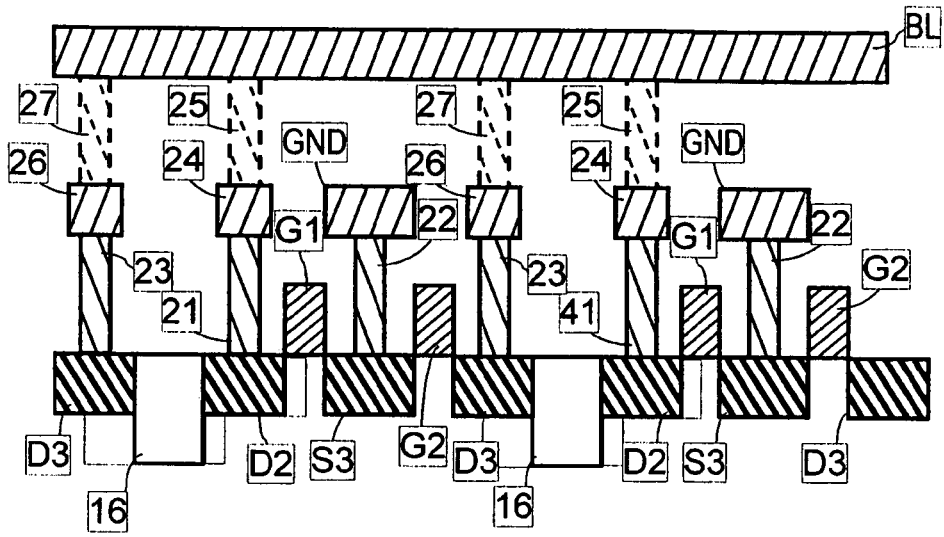
FIGS. 6 and 7 show in cross section two other variants of memory cells with a common source, according to the prior art.
Figure 7:
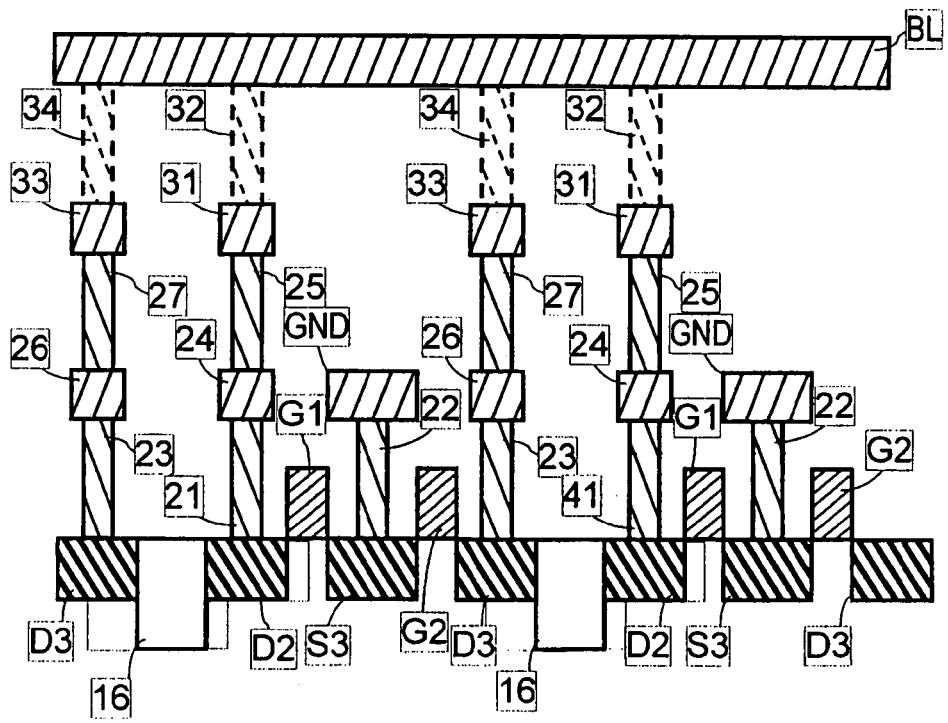

Each of the sets of gates G4 presents a central widened part, in staggered form, presenting regularly spaced windows and two parts in bar form extending the ends of the part in staggered form. The drain regions D4 of the memory cell storage transistors are formed in the substrate 50 at the base of the rectangular windows formed by the set of gates. The source regions S4, S5 are formed in the substrate at the base of the intermediate spaces between the sets of gates G4. The drain regions D4 are connected to bit lines BL formed in a first metallization plane by means of optional via 41 depending on whether the memory cell is assigned the value 0 or 1 (case of FIG. 1A). The source regions S4, S5 are connected to a reference potential (for example the ground) by means of via 43 formed on the substrate at the base of the spaces separating the parts in bar form of the sets of gates G4, these via being connected to the ground by means of source lines GND formed at the base of the source regions S4, S5.

Figure 9:
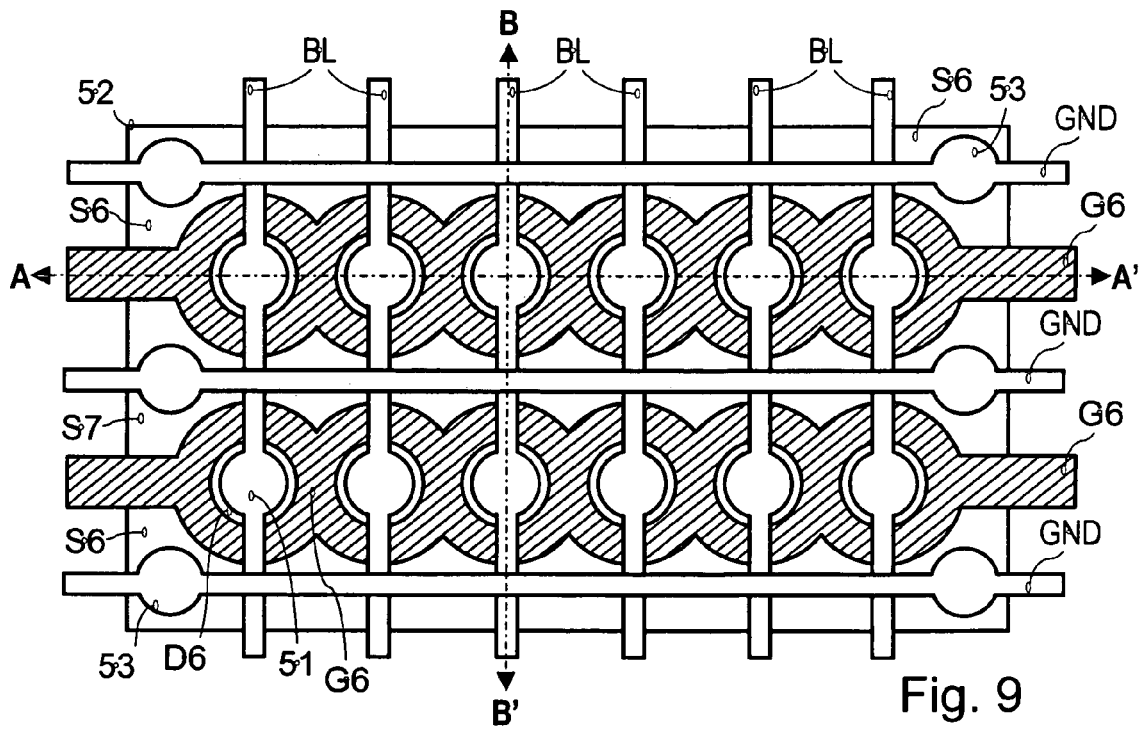
FIG. 9 represents in plan view another embodiment of memory cells according to the invention.

FIG. 9 represents a variant embodiment of the invention. Unlike FIG. 8, this FIG. shows 12 memory cells formed with two sets of gates G6, and each set of gates presents some windows that are not rectangular, but essentially circular.

Figure 10:
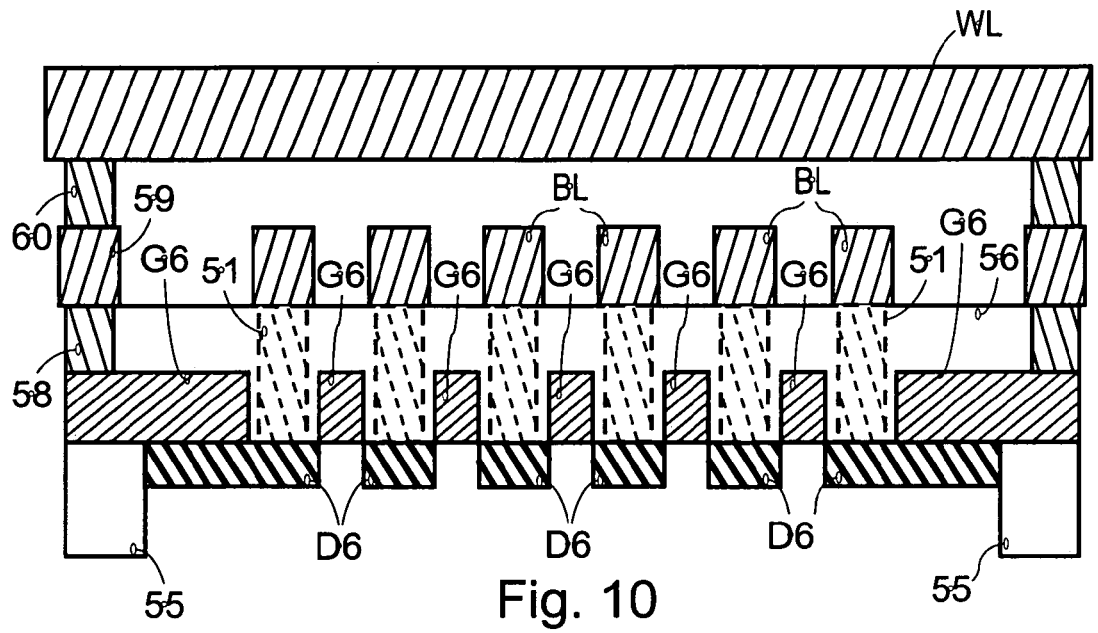
FIGS. 10 and 11 are views in cross section of the memory cells represented in FIG. 9.
Figure 11:
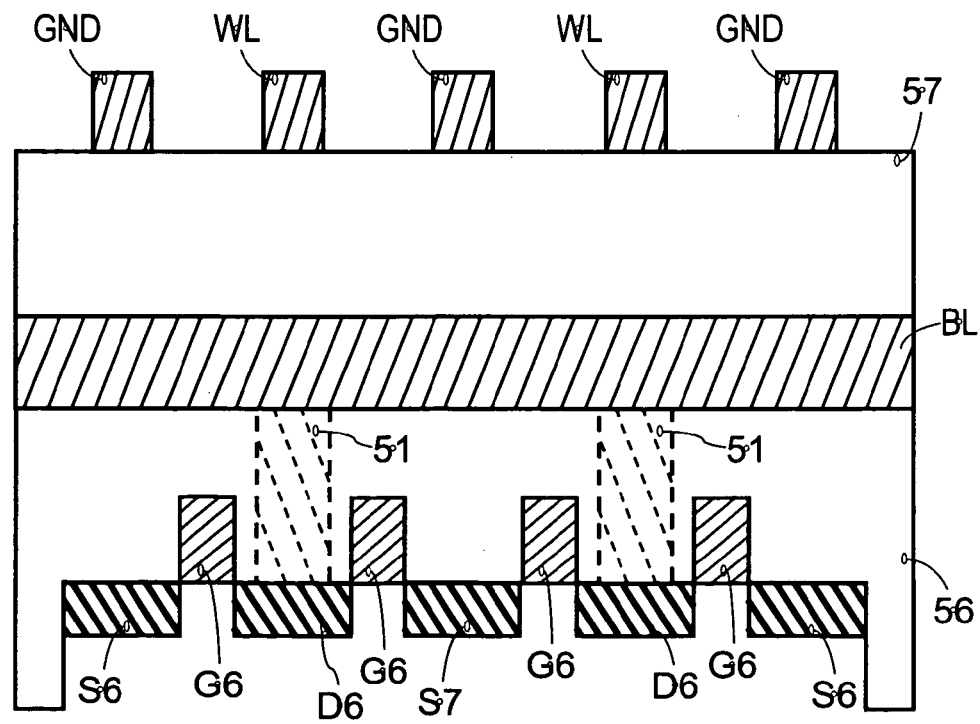

FIGS. 10 and 11 show the portion of memory represented in FIG. 9 in cross section along a symmetry axis AA' of a set of gates G6 (FIG. 10), and along a symmetry axis BB' of a bit line (FIG. 11) respectively.

The drain regions D6 of the memory cell storage transistors are formed in the substrate 52 at the base of the circular windows formed by the sets of gates G6. The source regions S6, S7 are formed in the substrate at the base of the intermediate spaces between the sets of gates. The drain regions D4 are connected to bit lines BL formed in a first metallization plane by means of optional via 51 depending on whether the memory cell is assigned the value 0 or 1. The source regions S6, S7 are connected to a source reference potential (for example the ground) by means of via 53 formed on the substrate at the base of the spaces separating the parts in bar form of the sets of gates G6, these via being connected to the source potential by means of source lines GND formed at the base of the source regions S6, S7.

In FIGS. 10 and 11, two first metallization planes are also represented in which are formed respectively bit lines BL on the one hand and word lines WL and source lines GND on the other hand, these planes being separated from the substrate and between them by respective insulating layers 56, 57. Metallization posts 48 connect the sets of gates G6 to the word lines WL formed in the second metallization plane. Each of these metallization posts 48 include a first via 58 joining a set of gates to an electroplated zone 59 of the first metallization plane in which bit lines BL are formed, and a second via 60 joining the zone 59 to a word line WL.

Of course, a different distribution of bit, word and source lines can be chosen in the different metallization planes. The word and source lines can thus be arranged in the first metallization plane and the bit lines in the second or third metallization plane.

In FIGS. 8 to 11, the storage transistor of each memory cell according to the invention therefore presents a drain region delimited by the contours of the windows formed in the gate material and sources regions delimited by the spaces between the sets of gates. In a transverse plane, the storage transistor of each memory cell presents an essentially symmetrical structure including a central drain region, two source regions on both sides of the drain region and a gate including two gate portions opposite the storage transistor channel between the drain region and the source regions.

The arrangement according to the invention of the memory cell storage transistors is equivalent to increasing in a significant manner the "width" of transistors, thus making it possible to increase the drain-source current of the transistors and therefore the reading speed of a memory cell, without increasing in a significant manner the area of the substrate occupied by each memory cell. Tests have shown that this arrangement makes it possible to obtain an increase in the reading current by a factor of 2.6, and therefore a proportional increase of the reading speed, without increasing in a significant manner the area of the memory cells (only ±15.6% in CMOS065 technology).

The invention claimed is:

1. An integrated circuit read-only memory comprising:
an electrically conductive word line;
an electrically conductive bit line; and
a first memory cell aligned with the bit line and including one storage transistor realized in a semiconductor substrate and including a source connected to a reference potential, a gate connected to the word line, and a drain connected to the bit line by a connection to provide the first memory cell with a first value, wherein the gate of the storage transistor of the first memory cell is formed on the substrate, in a form of a window having an inner contour that delimits the drain in the substrate, and an outer contour that delimits the source in the substrate; and
a second memory cell aligned with the bit line and including one storage transistor realized in the semiconductor substrate and including a source connected to the reference potential, a gate connected to the word line, and a drain not connected to the bit line to provide the second memory cell with a second value, wherein the gate of the storage transistor of the second memory cell is formed on the substrate, in a form of a window having an inner contour that delimits the drain of the storage transistor of the second memory cell in the substrate, and an outer contour that delimits the source of the storage transistor of the second memory cell in the substrate.

2. The memory according to claim 1, further comprising plural memory cells having respective storage transistors with respective gates comprising respective widened parts including respective windows having respective inner contours delimiting respective drain regions in the substrate, and outer contours delimiting respective source regions in the substrate.

3. The memory according to claim 2 wherein the source regions are connected to the reference potential by connections formed on the substrate on both sides of end portions of the set of gates, narrower than the widened parts including the windows.

4. The memory according to claim 2 wherein the gates are connected to the word line by connections formed on respective end parts of the gates, narrower than the widened parts including the windows.

5. The memory according to claim 2 wherein the source regions of the plural memory cells are connected to the reference potential by an electrically conductive source line, the bit line being realized in a first electrically conductive plane separated from the substrate by a first insulating layer, the word lines and source line being realized in a second electrically conductive plane separated from the first electrically conductive plane by a second insulating layer.

6. The memory according to claim 2 wherein the source regions of the plural memory cells are connected to the reference potential by an electrically conductive source line, the word lines and source line being realized in a first electrically conductive plane separated from the substrate by a first insulating layer, the bit line being realized in a second electrically conductive plane separated from the first plane by a second insulating layer.

7. The memory according to claim 1 wherein the inner contour of the gate window of each storage transistor is substantially rectangular.

8. The memory according to claim 1 wherein the inner contour of the gate window of each storage transistor is substantially circular.

9. An integrated circuit memory, comprising:
an electrically conductive word line;
electrically conductive first and second bit lines; and
a plurality of memory cells, each memory cell including a storage transistor realized in a semiconductor substrate and including a gate connected to the word line, a source region, and a drain region, the gate of the storage transistor of each memory cell being formed on the substrate in a form of a window having an inner contour that delimits a central region in the substrate and an outer contour that delimits the source region in the substrate, the drain region being positioned in the central region, wherein the source regions are connected to a reference potential by an electrically conductive source line, the memory cells including first and second memory cells aligned with the first and second bit lines, respectively, the drain region of the first memory cell being electrically connected to the first bit line to obtain a first logic value for the first memory cell, the drain region of the second memory cell being not electrically connected to the second bit line to obtain a second logic value for the second memory cell, the bit lines being realized in a first electrically conductive plane separated from the substrate by a first insulating layer, the word line and source line being realized in a second electrically conductive plane separated from the first electrically conductive plane by a second insulating layer.

10. The memory according to claim 9 wherein the inner contour of the gate window of each storage transistor is substantially rectangular.

11. The memory according to claim 9 wherein the inner contour of the gate window of each storage transistor is substantially circular.

12. The memory according to claim 9 wherein the gate windows form a widened part of a continuous conductive layer which includes first and second narrow portions continuous with first and second end portions of the widened part, respectively, the narrow portions being more narrow than the widened part.

13. The memory according to claim 12, further comprising source connections formed on the substrate on opposite sides of the narrow portions, the source connections connection the source regions to a reference potential.

14. The memory according to claim 12 wherein the gates are connected to the word line by connections formed on the narrow portions.

15. An integrated circuit memory, comprising:
an electrically conductive word line;
electrically conductive first and second bit lines
a plurality of memory cells, each memory cell including a storage transistor realized in a semiconductor substrate and including a gate connected to the word line, a source region, and a drain region, the gate of the storage transistor of each memory cell being formed on the substrate in a form of a window having an inner contour that delimits a central region in the substrate and an outer contour that delimits the source region in the substrate, the drain region being positioned in the central region, wherein the source regions are connected to a reference potential by an electrically conductive source line, the memory cells including first and second memory cells aligned with the first and second bit lines, respectively, the drain region of the first memory cell being electrically connected to the first bit line to obtain a first logic value for the first memory cell, the drain region of the second memory cell being not electrically connected to the second bit line to obtain a second logic value for the second memory cell, the word line and source line being realized in a first electrically conductive plane separated from the substrate by a first insulating layer, and the bit lines being realized in a second electrically conductive plane separated from the first plane by a second insulating layer.

16. The memory according to claim 15 wherein the inner contour of the gate window of each storage transistor is substantially rectangular.

17. The memory according to claim 15 wherein the inner contour of the gate window of each storage transistor is substantially circular.

18. The memory according to claim 15 wherein the gate windows form a widened part of a continuous conductive layer which includes first and second narrow portions continuous with first and second end portions of the widened part, respectively, the narrow portions being more narrow than the widened part.

19. The memory according to claim 18, further comprising source connections formed on the substrate on opposite sides of the narrow portions, the source connections connection the source regions to a reference potential.

20. The memory according to claim 18 wherein the gates are connected to the word line by connections formed on the narrow portions.

* * * * *

UNITED STATES PATENT AND TRADEMARK OFFICE
CERTIFICATE OF CORRECTION

PATENT NO. : 7,646,069 B2
APPLICATION NO. : 11/337101
DATED : January 12, 2010
INVENTOR(S) : Schoellkopf et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 819 days.

Signed and Sealed this

Sixteenth Day of November, 2010

David J. Kappos
*Director of the United States Patent and Trademark Office*